(12) United States Patent
Shin et al.

(10) Patent No.: US 7,982,552 B2
(45) Date of Patent: Jul. 19, 2011

(54) AUTOMATIC FREQUENCY CALIBRATION APPARATUS AND METHOD FOR A PHASE-LOCKED LOOP BASED FREQUENCY SYNTHESIZER

(75) Inventors: Hyunchol Shin, Seoul (KR); Jaewook Shin, Seoul (KR)

(73) Assignee: Kwangwoon University Industry-Academic Collaboration Foundation, Seoul (LR)

( * ) Notice: Subject to any disclaimer, the term of this patent is extended or adjusted under 35 U.S.C. 154(b) by 151 days.

(21) Appl. No.: 12/423,061

(22) Filed: Apr. 14, 2009

(65) Prior Publication Data

US 2010/0213984 A1    Aug. 26, 2010

(30) Foreign Application Priority Data

Feb. 24, 2009   (KR) .................. 10-2009-0015264

(51) Int. Cl.
*H03B 5/10*   (2006.01)
(52) U.S. Cl. .................. 331/177 R; 331/1 A; 331/1 R; 331/10; 331/11; 331/45
(58) Field of Classification Search .................. 331/1 A, 331/1 R, 10, 11, 45, 177 R
See application file for complete search history.

(56) References Cited

U.S. PATENT DOCUMENTS

| 6,483,391 | B1* | 11/2002 | Magoon et al. ............... 331/183 |
| 6,563,387 | B2* | 5/2003 | Hirano et al. .................... 331/11 |
| 6,806,781 | B2* | 10/2004 | Bisanti et al. ............... 331/36 R |
| 7,154,342 | B2* | 12/2006 | Munker et al. .................. 331/11 |
| 2003/0197564 | A1* | 10/2003 | Humphreys et al. ........... 331/11 |
| 2003/0224749 | A1* | 12/2003 | Uozumi et al. ............ 455/252.1 |
| 2007/0247248 | A1* | 10/2007 | Kobayashi et al. ........... 331/167 |
| 2007/0264951 | A1* | 11/2007 | Cho et al. ................... 455/182.3 |
| 2008/0042760 | A1* | 2/2008 | Marutani ........................ 331/49 |
| 2009/0164827 | A1* | 6/2009 | Komninakis et al. ......... 713/500 |

* cited by examiner

*Primary Examiner* — Joseph Chang
*Assistant Examiner* — Jeffrey Shin
(74) *Attorney, Agent, or Firm* — Edwards Angell Palmer & Dodge LLP; Kongsik Kim

(57) ABSTRACT

An automatic frequency calibration apparatus and a method thereof for a phase-locked loop based frequency synthesizer are disclosed. The apparatus includes a frequency-to-digital converter configured to convert a frequency of a VCO output signal to a first digital value, a target value setting section configured to provide a second digital value corresponding to a target frequency, and a finite state machine configured to calibrate the frequency of the VCO output signal by using the difference of the first digital value and the second digital value. Accordingly, the calibration speed and a frequency resolution of the automatic frequency calibration apparatus in a frequency synthesizer may be enhanced.

12 Claims, 12 Drawing Sheets

(a)

(b)

AUTOMATIC FREQUENCY CALIBRATION APPARATUS AND METHOD FOR A PHASE-LOCKED LOOP BASED FREQUENCY SYNTHESIZER

CROSS-REFERENCE TO RELATED APPLICATIONS

This application claims priority from Korean Patent Application No. 2009-15264 filed on Feb. 24, 2009, the contents of which are incorporated herein by reference in its entirety.

TECHNICAL FIELD

Examples embodiments of the present invention relate to an automatic frequency calibration apparatus and a method thereof for a phase-locked loop based frequency synthesizer, more particularly relate to an apparatus and a method of enhancing a frequency calibration speed and resolution.

RELATED ART

A RF frequency synthesizer generates a local oscillation signal, and is an essential circuit element for wireless communication transmitters and receivers.

The RF frequency synthesizer widely uses a phase-locked loop (PLL) technique for locking its output frequency to a target frequency.

In the PLL, the time taken to lock the voltage controlled oscillator (VCO) frequency to the target frequency is referred to as a locking time. These days, more rapid locking time has been required in modern wireless communication systems.

In addition, a wideband and low phase noise RF frequency synthesizer typically uses a VCO including a switched capacitor array bank (hereinafter, referred to as "cap bank").

To automatically select a proper control code for the cap bank before it starts the closed loop locking process, the frequency synthesizer needs an additional circuitry called an automatic frequency calibration circuit (AFC) which calibrates the VCO frequency to a frequency that is closest to the target frequency at a given VCO control voltage.

After the AFC finishes the automatic frequency calibration process, the PLL starts the closed loop locking process to lock the VCO frequency to the target frequency.

FIG. 1 is a block diagram of a conventional RF frequency synthesizer including an AFC.

In FIG. 1, a VCO 100 has a cap bank 102, and the AFC 104 finds a proper control code for the cap bank 102.

As shown in FIG. 1, the frequency synthesizer includes a programmable frequency divider 106, a phase/frequency detector 108 and a low pass filter (loop filter, LPF) 110.

A time (frequency calibration time) that is taken to find the control code for the cap bank 102 through the AFC 104 causes the whole locking process of the frequency synthesizer to become further slower.

Since the additional time taken to find the control code should increase the overall power consumption and decrease the effective data rate in a wireless communication system, it is important to reduce the frequency calibration time of AFC in PLL design.

In addition, the frequency resolution of AFC is another important design parameter especially for a fractional-N frequency synthesizer.

FIG. 2 is a view illustrating frequency tuning characteristic curves of a typical VCO.

First, frequency tuning characteristics of a conventional fractional-N frequency synthesizer will be described with reference to FIG. 2A.

As shown in FIG. 2A, a case where a frequency space ($f_{spacing}$) between two adjacent characteristic curves of the VCO is smaller than a reference frequency $f_{REF}$, occurs frequently. Therefore, the frequency resolution of the AFC should be smaller than the frequency space ($f_{spacing}$) between adjacent characteristic curves for accurate operation of the AFC. This means that the frequency resolution of the AFC must be smaller than the reference frequency $f_{REF}$.

A similar situation may occur also in a conventional wideband frequency synthesizer although it is an integer-N frequency synthesizer.

Referring to FIG. 2B, in a wideband frequency synthesizer, the VCO gain $K_{VCO}(n)$ and the frequency space ($f_{spacing}(n)$) between adjacent characteristic curves vary much against the control code n of the cap bank.

For example, it is well known that the variation rate of the $f_{spacing}(n)$ is proportional to the cubed power of a ratio of a maximum operation frequency and a minimum operation frequency of the VCO in case that the binary weighted cap bank is used (J. Kim et al., "A Wideband CMOS LC VCO with Linearized Coarse Tuning Characteristics," IEEE Tran. Circuits and Systems-II: Express Brief, vol. 55, no. 5, page 399-403, May 2008).

In this case, the $f_{spacing}(n)$ is often found to be smaller than the reference frequency $f_{REF}$. This requires that the frequency resolution of the AFC must be smaller than the reference frequency $f_{REF}$ in the frequency synthesizer even though it is a integer-N type.

However, in the frequency synthesizer using the conventional AFC in FIG. 1, the frequency resolution of the AFC is usually limited to the reference frequency $f_{REF}$, or an extremely long frequency calibration time is needed for obtaining the frequency resolution smaller than the reference frequency $f_{REF}$.

On the other hand, a further important issue for the AFC is a frequency comparison method used for the frequency calibration.

One of the previous AFC techniques compares the divider output frequency $f_{DIV}$ and the reference frequency $f_{REF}$ by using dedicated counters.

This frequency comparator based calibration technique is widely used at present. However, its frequency calibration speed is up to approximately several tens of micro-seconds.

This frequency comparator based calibration technique counts two pulses simultaneously, and then compares the frequency $f_{DIV}$ with the reference frequency $f_{REF}$ in a relative sense using a frequency comparator. Here, since the input frequency to the counter is a relatively low frequency that is close to the reference frequency $f_{REF}$, it takes relatively long calibration time, e.g. tens or hundreds of micro-seconds to obtain a required frequency resolution.

Another calibration technique is also used, which first converts the input frequencies to voltages by using a time-to-voltage converter (TVC) and then compares the voltages.

For the TVC technique, the frequency calibration process is done very fast, i.e. typically very short frequency calibration time of approximately less than a micro-second is taken. However, the fundamental problem is that the frequency resolution is fixed at the reference frequency $f_{REF}$ due to its own voltage comparison method, and thus this calibration technique cannot be applied to the fractional-N frequency synthesizer that typically requires a frequency resolution better than the reference frequency $f_{REF}$.

The above information disclosed in this Related Art section is only for enhancement of understanding of the background of the invention and therefore it may contain information that does not form the prior art that is already known in this country to a person of ordinary skill in the art.

SUMMARY OF DISCLOSURE

Accordingly, the present invention is provided to substantially obviate one or more problems due to limitations and disadvantages of the related art.

Example embodiments of the present invention provide an automatic frequency calibration apparatus and a method thereof for a phase-locked loop based frequency synthesizer to reduce the frequency calibration time dramatically while obtaining the frequency resolution smaller than the reference frequency.

In one aspect, the present invention provides an automatic frequency calibration apparatus for a phase-locked loop based frequency synthesizer, the apparatus comprising: a frequency-to-digital converter configured to convert the frequency of a VCO output signal into a first digital value; a target value setting section that is to provide a second digital value corresponding to the target frequency; and a finite state machine that is configured to calibrate the frequency of the VCO output signal by referring to a difference of the first digital value and the second digital value.

In another aspect, the present invention provides an automatic frequency calibration apparatus for a phase-locked loop based fractional-N frequency synthesizer, the apparatus comprising: a frequency divider configured to divide a frequency of VCO output signal with a given dividing ratio and simultaneously generate multiple phase signals at its divider output; and at least one counter configured to count the multiple phase signals. Here, the frequency of the VCO output signal is converted into the first digital value through the counter, the first digital value is compared with the second digital value corresponding to the target frequency, and the frequency of the VCO output signal is calibrated in accordance with the compared result.

In still another aspect, the present invention provides an automatic frequency calibration method for a phase-locked loop based fractional-N frequency synthesizer, the method comprising: direct counting of a VCO output signal; and comparing the first digital value in accordance with the counted result with the second digital value corresponding to a target frequency, and calibrating the frequency of the VCO output signal in accordance with the compared result.

An automatic frequency calibration apparatus according to one example embodiment of the present invention directly counts the frequency of a signal generated by a VCO and then compares the first digital value corresponding to the counted result with the second digital value corresponding to the target frequency. Accordingly, the automatic frequency calibration apparatus may find the accurate difference of the frequency of the VCO signal and the target frequency.

In addition, the automatic frequency calibration apparatus generates multiple phase signals so as to convert the frequency of the VCO signal into the first digital value and then counts individually each multi-phase signal, and thus the frequency calibration speed may be enhanced.

Furthermore, the automatic frequency calibration apparatus uses the second digital value, which is a constant value, corresponding to the target frequency for the comparison, and so the frequency calibration speed in a frequency synthesizer may be enhanced.

Moreover, the automatic frequency calibration apparatus calibrates the frequency of the VCO signal with the frequency resolution smaller than the reference frequency $f_{REF}$, and thus the frequency of the VCO signal may be accurately calibrated.

BRIEF DESCRIPTION OF DRAWINGS

Example embodiments of the present invention will become more apparent by describing in detail example embodiments of the present invention with reference to the accompanying drawings, in which.

DETAILED DESCRIPTION

Figure 1:
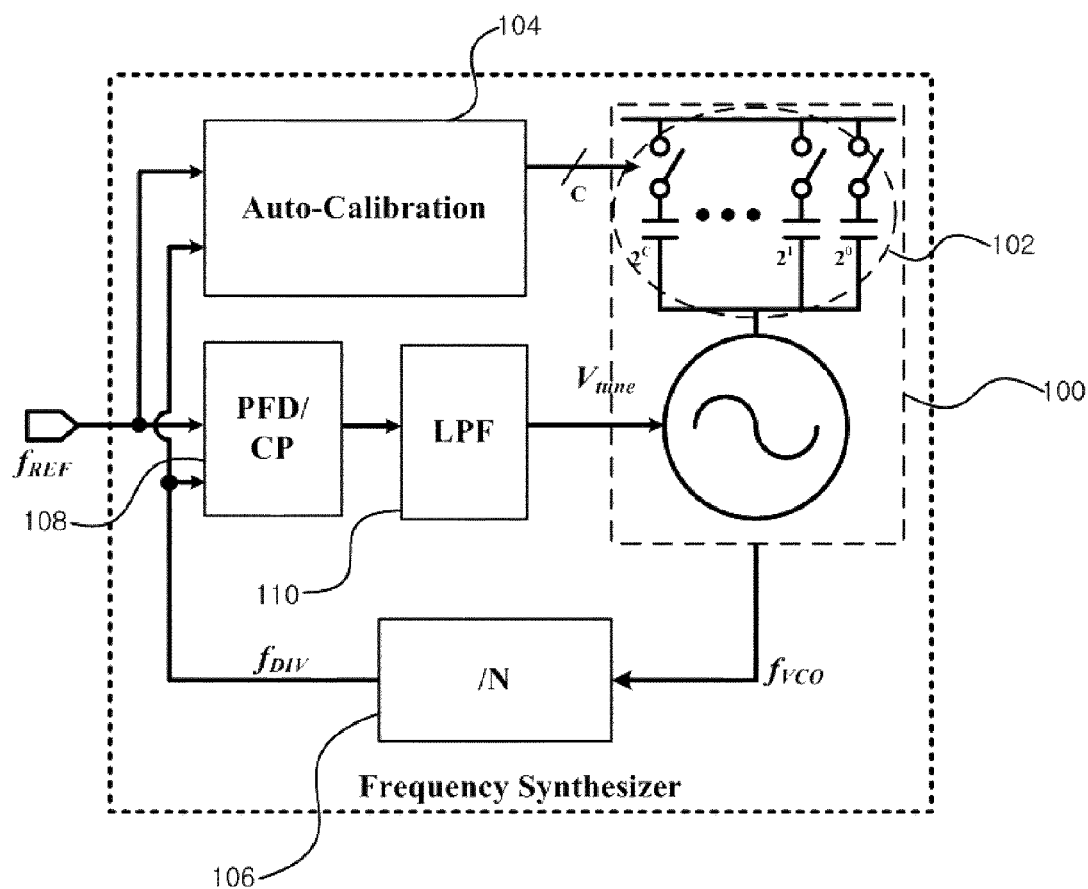
FIG. 1 is a block diagram of a conventional RF frequency synthesizer including a conventional AFC.
Figure 2:
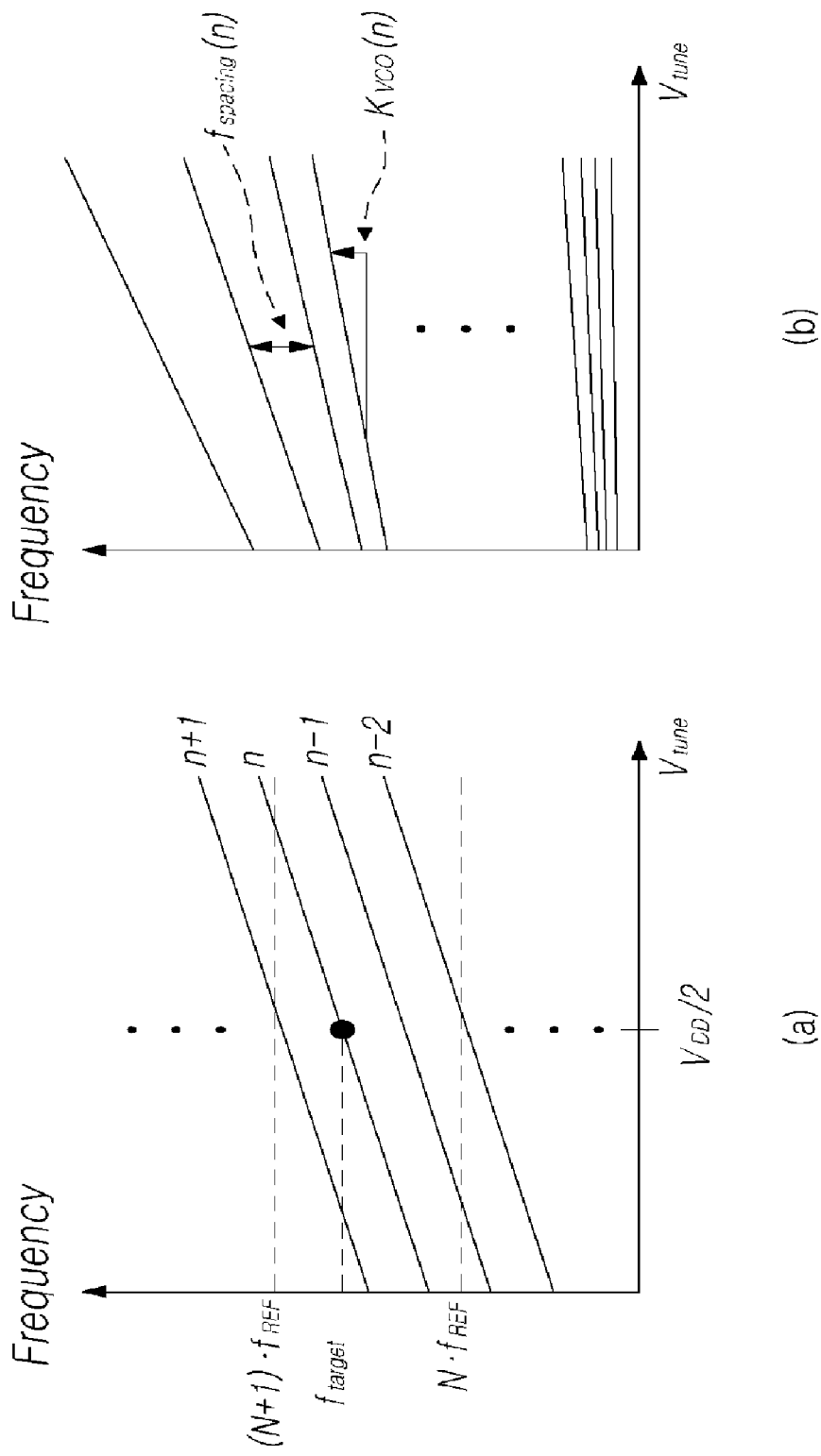
FIG. 2 is a view illustrating a VCO frequency tuning characteristic curves (a) Closely spaced frequency tuning curves. (b) Typical frequency tuning characteristic curves of a wideband VCO.

Example embodiments of the present invention are disclosed herein. However, specific structural and functional details disclosed herein are merely representative for the purpose of describing example embodiments of the present invention, however, example embodiments of the present invention may be embodied in many alternate forms and should not be construed as limited to example embodiments of the present invention set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

It will be understood that, although the terms first, second, etc., may be used herein to describe various elements, these elements should not be limited by these terms. These terms are only used to distinguish one element from another. For example, the first element could be termed the second element, and, similarly, the second element could be termed the first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by a person of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

An automatic frequency calibration apparatus of the present invention calibrates an output frequency of a voltage controlled oscillator (VCO) to become very close to a target frequency. The automatic frequency calibration apparatus may be referred to as an automatic frequency calibration circuit, an automatic frequency calibration device, or an automatic frequency control circuit without limited as the apparatus.

Figure 3:
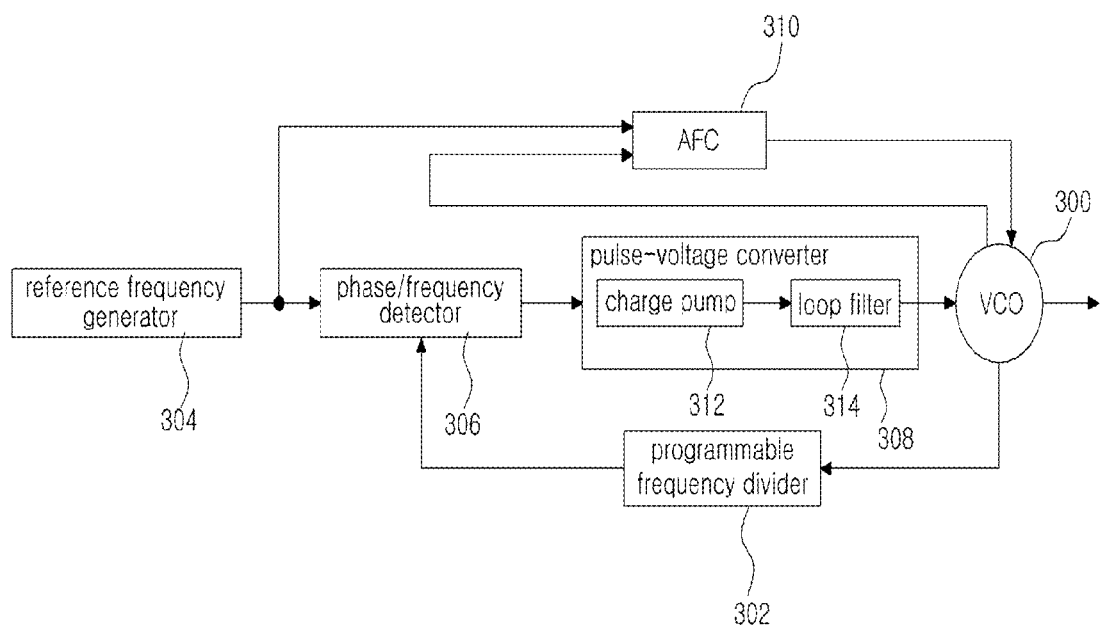
FIG. 3 is a block diagram of RF frequency synthesizer with an automatically frequency calibration apparatus according to one example embodiment of the present invention.

FIG. 3 is a block diagram of an RF frequency synthesizer with the automatic frequency calibration apparatus according to one example embodiment of the present invention.

In FIG. 3, the frequency synthesizer of the present embodiment includes a phase-locked loop PLL, having a voltage controlled oscillator VCO 300, a programmable frequency divider 302, a reference frequency generator 304, a phase/frequency detector 306 and a pulse-voltage converter 308, and an automatic frequency calibration loop having the VCO 300 and an automatic frequency calibration apparatus AFC 310.

Firstly, the PLL will be described.

The VCO 300 outputs a VCO signal at a certain frequency.

The VCO signal is fed to the programmable frequency divider 302 for the purpose of locking its phase.

The programmable frequency divider 302 divides the VCO signal with a given dividing ratio, and then provides the divided signals. Here, the programmable frequency divider 302 may divide the frequency of VCO signal with a fractional dividing ratio. On the other hand, in an integer-N frequency synthesizer, the programmable frequency divider 302 may divide the VCO signal with an integer dividing ratio. This case is also included in a scope of the present invention.

The phase/frequency detector 306 compares a phase and a frequency of the divided signal with those of a signal fed from the reference frequency generator 304, and then provides a pulse corresponding to difference of the phases (or frequencies).

The pulse-voltage converter 308 includes a charge pump 312 and a loop filter 314.

The charge pump 312 adjusts the amount of effective charge in accordance with the output pulse from the phase/frequency detector 306, and then a voltage corresponding to the adjusted charge amount is provided to the VCO 300 through the loop filter 314.

The above processes are repeatedly performed until the frequency of the VCO signal is locked to a target frequency.

In one example embodiment of the present invention, the frequency synthesizer may be a delta-sigma fractional-N frequency synthesizer. Here, the PLL may include further a delta-sigma modulator.

To generate the target frequency in the frequency synthesizer, an automatic frequency calibration loop, for calibrating the frequency of the VCO signal to a frequency close to the target frequency through a method of controlling properly a cap bank 408, operates in an open-loop configuration before the PLL starts the closed-loop locking process.

The AFC 310 finds the difference between the digitally converted values of the VCO signal frequency and the target frequency, and then performs the frequency calibration by utilizing the found difference in the automatic frequency calibration loop.

Figure 4:
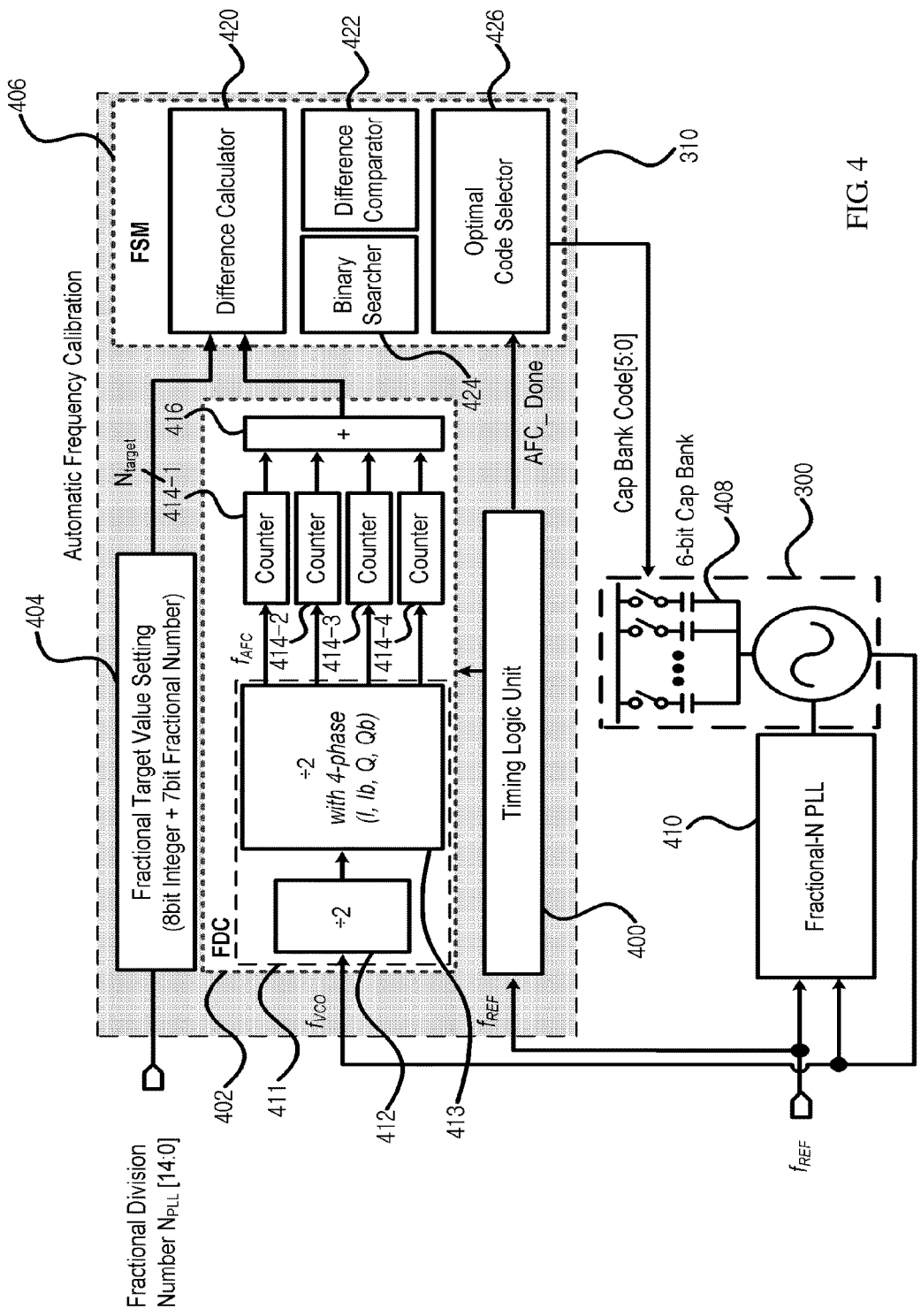
FIG. 4 is a detail block diagram of the AFC according to one example embodiment of the present invention.

FIG. 4 is a view illustrating the AFC according to one example embodiment of the present invention. FIG. 4 shows the AFC 310 employed in the delta-sigma fractional-N frequency synthesizer.

In FIG. 4, the AFC 310 of the present embodiment includes a timing logic unit 400, a frequency-to-digital converter FDC 402, a fractional target value setting section 404 and a finite state machine FSM 406.

The VCO 300 in FIG. 4 has the cap bank 408. The numerical number 410 corresponds to the PLL except the VCO 300 in FIG. 3.

The timing logic unit 400 generates timing signals for start and end of the frequency calibration, and various clocking signals required for synchronized and sequential operation of the AFC 310.

The frequency-to-digital converter 402 starts its operation after a synchronized start signal is provided by the timing logic unit 400.

In one example embodiment of the present invention, the frequency-to-digital converter 402 converts the VCO frequency $f_{vco}$ into a digital value, and outputs the digital value.

The frequency-to-digital converter 402 includes a frequency divider 411, at least one counter 414 and an adder 416.

The frequency divider 411 divides the frequency of VCO signal with a given dividing ratio.

In one example embodiment of the present invention, the frequency divider 411 divides the frequency of VCO signal and generates multiple phase signals at the divider output. Here, the frequency of each multiple phase output signal will be referred to as an AFC signal frequency $f_{AFC}$ of the AFC 310.

Hereinafter, it is assumed that the frequency divider 411 divides the frequency of VCO signal by four, and the output signals have an equally spaced phase difference of 90°. In this case, the frequency-to-digital converter 402 may include the first frequency divider 412 to divide the frequency of VCO signal by two, and a multiple phase generator 413 to divide the divided-by-two signal by two again and generate the quad-phase signals.

The frequency-to-digital converter 402 includes four counters 414-1 to 414-4 corresponding to the number of the multiple phase signals.

The counters 414-1 to 414-4 count individually the corresponding multiple phase signals.

Values counted by the counters 414-1 to 414-4 are added by the adder 416, and then the added value is provided by the adder 416.

In brief, the AFC 310 of the present embodiment counts individually the frequency-divided multiple phase signals, and thus the operation speed of each counter 414-1 to 414-4 is reduced while the accuracy of the frequency-to-digital converter is not sacrificed.

Figure 5:
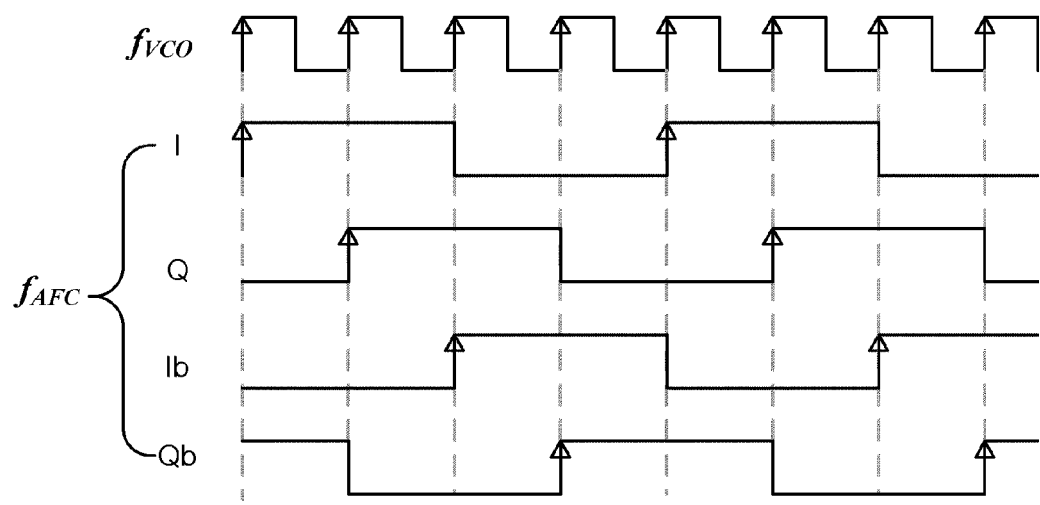
FIG. 5 is a timing diagram illustrating the divided multiple phase signals in the frequency-to-digital converter according to one example embodiment of the present invention.

FIG. 5 is a timing diagram illustrating the divided quad-phase signals in the frequency-to-digital converter according to one example embodiment of the present invention.

In FIG. 5, the divider 411 generates the quad-phase signals with the phase difference 90°, i.e. I, Q, $I_b$ and $Q_b$ generated by dividing the VCO signal, and the effective frequency of the aggregate quad-phase signals is equal to the original input frequency of $f_{VCO}$.

Subsequently, the counters 414-1 to 414-4 count rising edges of the multiple phase signals I, Q, $I_b$ and $Q_b$, respectively. Here, since the four multiple phase signals have the same phase difference 90° as shown in FIG. 5, the output values from the counters 414-1 to 414-4 may be identical to a value obtained by counting directly the VCO signal.

Figure 6:
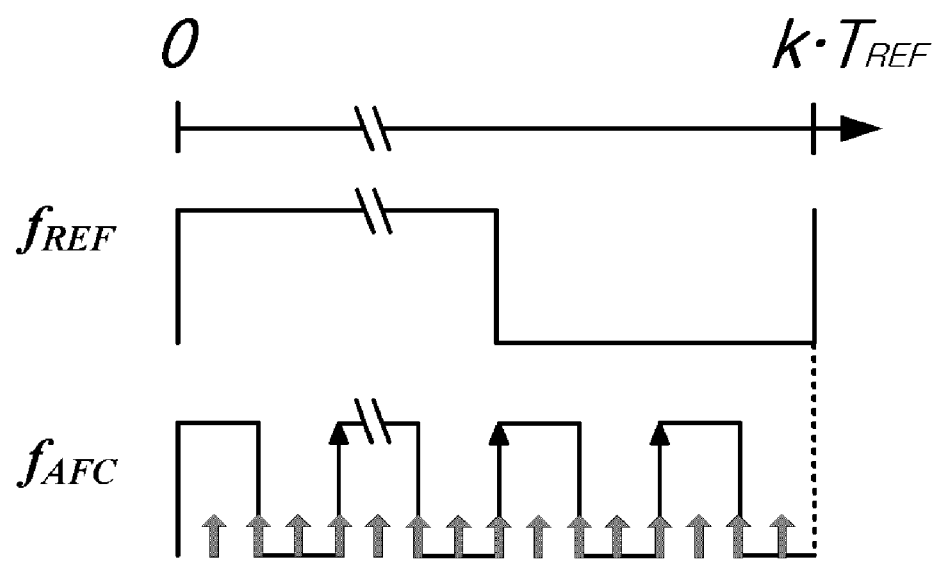
FIG. 6 is a timing diagram illustrating the relationships of the reference signal ($f_{REF}$), the counter input signal ($f_{AFC}$), and the multiple phase edges of the automatic frequency calibration apparatus according to one example embodiment of the present invention.

In one example embodiment of the present invention, in case of counting the VCO signal during the time period of $k \cdot T_{REF}$, the frequency resolution of the frequency-to-digital converter 402 is expressed as the following Equation 1. Here, the timing diagram of the input signal is shown in FIG. 6.

$$\frac{f_{REF}}{k}, \quad \text{[Equation 1]}$$

where k is an integer number.

In one example embodiment of the present invention, k is properly adjusted in accordance with the space ($f_{spacing}$) between adjacent characteristic curves for the purpose of the frequency calibration, and thus the frequency of the VCO signal may be accurately calibrated to the target frequency. For example, k may be set to a small value in a band where the space ($f_{spacing}$) is large, and set to a high value in a band where the space ($f_{spacing}$) is small.

In one example embodiment of the present invention, the frequency resolution may be controlled by adjusting k, i.e. the operation time of the counter 414.

The FSM 406 computes the difference between the output value from the frequency-to-digital converter 402 and the output value from the fractional target value setting section 404 and manipulates the control code for the cap bank 408 in accordance with the difference value. Here, the fractional target value setting section 404 provides the constant digital value $N_{target}$ corresponding to the target frequency.

The fractional target value setting section 404 may provides a digital value calculated by using an integer dividing ratio and a fractional dividing ratio. It is desirable that the fractional target value setting section 404 may calculate the digital value corresponding to the target frequency by using eight bit integer dividing ratio and seven bit fractional dividing ratio. In this case, the digital value may be calculated with the resolution of $f_{REF}/128$.

Since the digital value is a constant value, the frequency of the VCO signal may be accurately calibrated to the target frequency corresponding to the fractional dividing ratio in only a few periods of the reference signal although the delta-sigma modulator of the fractional-N frequency synthesizer is not operated.

In one example embodiment of the present invention, the FSM 406 calculates difference of the first digital value, corresponding to the frequency of the VCO signal, outputted from the frequency-to-digital converter 402 and the second digital value outputted from the fractional target value setting section 404, and adjusts the frequency of the VCO signal in accordance with the calculated difference.

After the frequency of the VCO signal is calibrated by the FSM 406 as described above, the frequency-to-digital converter 402 provides again the first digital value that is newly counted with the updated cap bank 408 code setting. Then, the FSM 406 compares the first digital value with the second digital value corresponding to the target frequency, and may calibrate again the frequency of the VCO signal. The cap bank 408 of the VCO 300 may be controlled in order for the frequency of the VCO signal to have the closest frequency to the target frequency by performing the above procedure repeatedly.

Referring to FIG. 4, the FSM 406 includes a difference calculator 420, a difference comparator 422, a binary searcher 424 and an optimal code selector 426.

The difference calculator 420 calculates the difference between the first digital value outputted from the frequency-to-digital converter 402 and the second digital value outputted from the fractional target value setting section 404, and provides a digital value corresponding to the difference.

In one example embodiment of the present invention, the difference calculator 420 outputs a flag signal of "FAST" or "SLOW" corresponding to the relative magnitude of the frequency of the VCO signal and the target frequency.

As described above, since the frequency of the VCO signal is repeatedly changed during the operation of the automatic frequency calibration apparatus, the difference value and the flag signal outputted from the difference calculator 420 may be changed.

The difference comparator 422 stores the least one of the difference values outputted from the difference calculator 420, and then compares a present difference value outputted from the difference calculator 420 with the pre-stored least difference value. Subsequently, the difference comparator 422 stores the smaller one between the present difference value and the pre-stored least difference value as a new least difference value.

Figure 7:
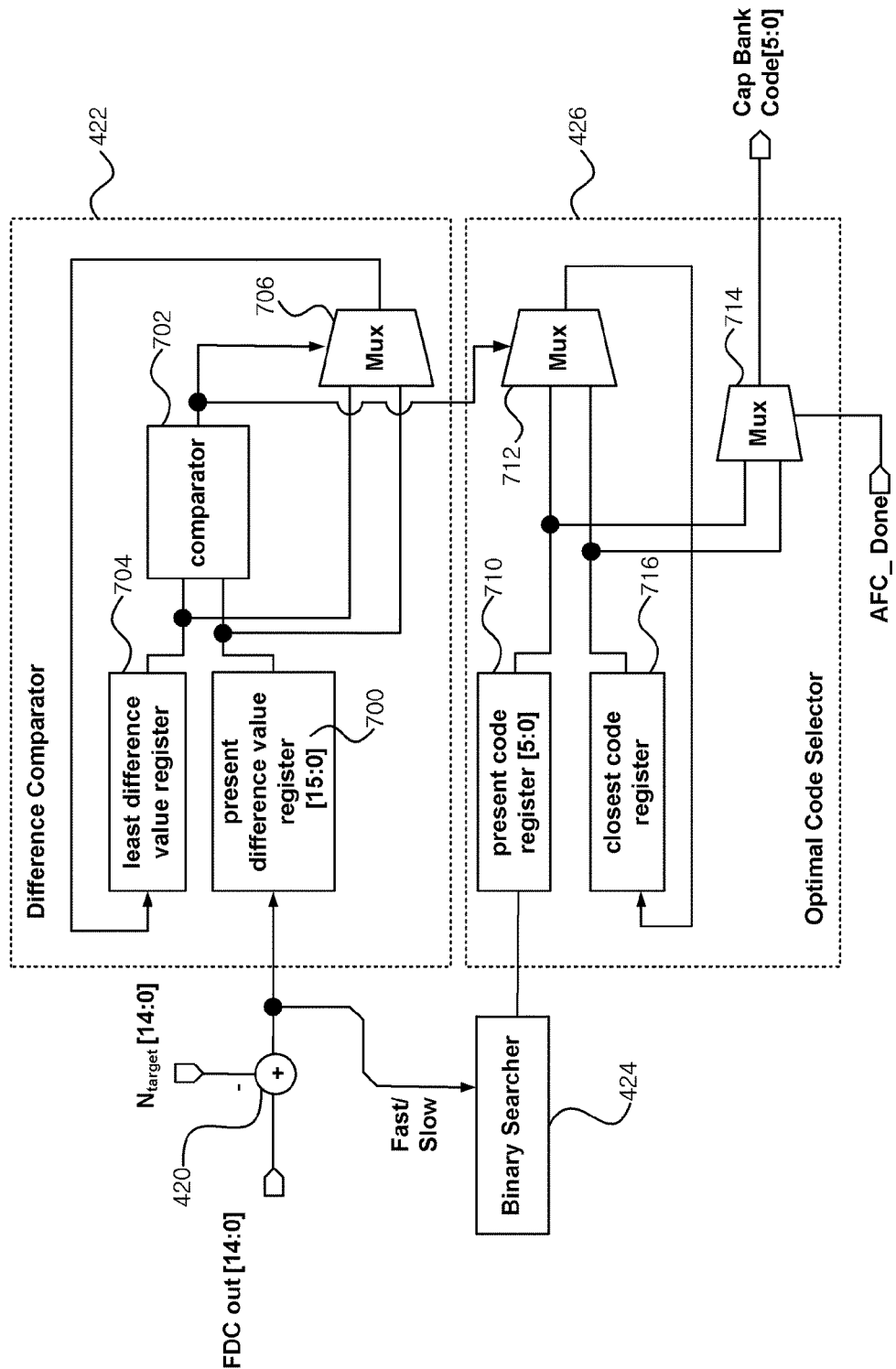
FIG. 7 is a block diagram illustrating a finite state machine according to one example embodiment of the present invention.

In FIG. 7, the difference comparator 422 may include a present difference value register 700, a comparator 702, a least difference value register 704 and a multiplexer 706.

The present difference value register 700 stores the present difference value provided by the difference calculator 420.

The least difference value register 704 stores the present difference value provided by the difference calculator 420 at the start of the automatic frequency calibration process.

When a new present difference value is provided by the difference calculator 420, the new present difference value is stored into the present difference value register 700.

The comparator 702 compares the present difference value with the least difference value stored in the least difference value register 704.

In case that the present difference value is smaller than the least difference value, the present difference value is updated to as a new least difference value.

The difference comparator 422 performs repeatedly the process of comparing the difference values and updating the least difference value.

The binary searcher 424 performs a binary search in accordance with the "FAST" or "SLOW" flag signal fed from the difference calculator 420. Here, the binary search means a process of searching the control code in a direction from the most significant bit toward the least significant bit of the control code to be searched.

In one example embodiment of the present invention, the binary searcher 424 searches the control code for calibrating the frequency of the VCO 300 to a frequency that is the closest to the target frequency.

In case that the VCO 300 has the cap bank 408 controlled by C bits, the binary search process is repeatedly performed by C times.

The binary searcher 424 searches the control code for the cap bank 408 from the preset initial code. Here, the binary searcher 424 searches the control code for reducing the relative difference of the target frequency and the frequency of the VCO signal. For example, in case that the control code for the cap bank 408 is made up of 3 bits, the control code for frequency calibration to the target frequency $f_{target}$ is determined as one of 000, 001, 010, 011, 100, 101, 110 and 111 as shown in FIG. 8.

Figure 8:
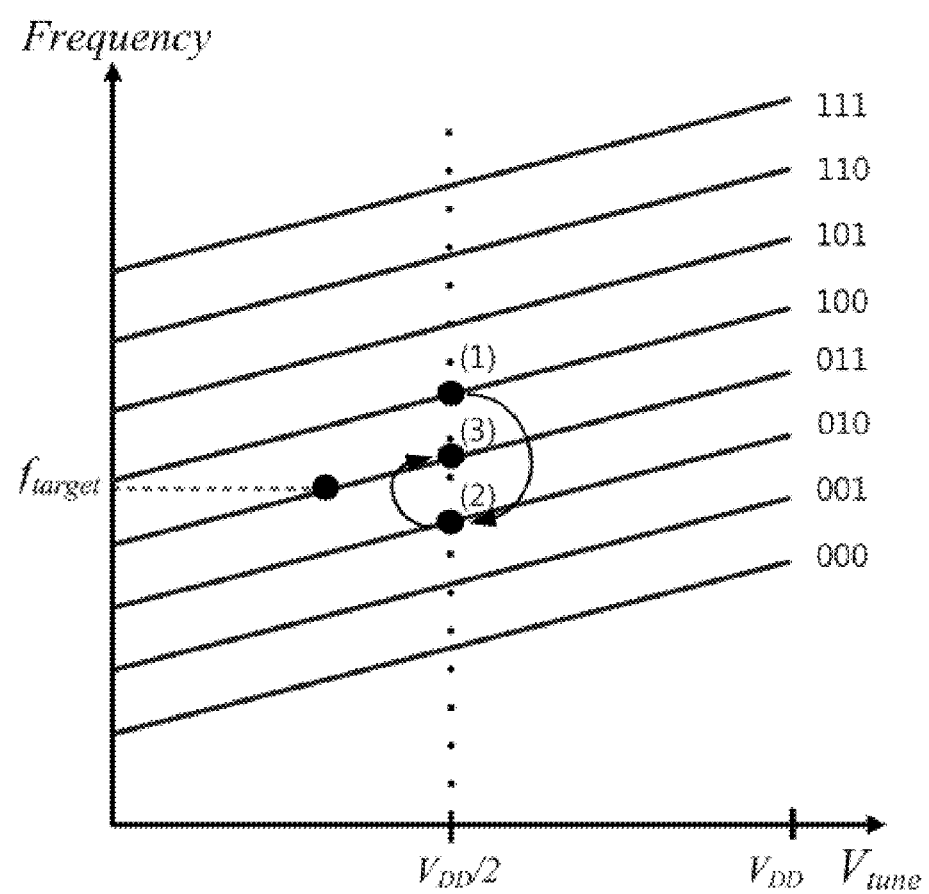
FIG. 8 is a view illustrating a binary search process of the automatic frequency calibration according to one example embodiment of the present invention.

Referring to FIG. 8, the initial code may be set as 100 corresponding to an intermediate value. Since the first digital value of the VCO signal outputted in accordance with the initial code is smaller than the second digital value corresponding to the target frequency, the difference calculator 420 outputs the slow flag signal.

The binary searcher 424 then provides 010 as a result of the binary search according as the slow flag signal is received.

Since the first digital value of the VCO signal outputted in accordance with 010 is now higher than the second digital value, the difference calculator 420 outputs the fast flag signal. As a result, the binary searcher 424 provides 011 which is an intermediate value of 100 and 010.

In case that the control code for the cap bank 408 is made up of 3 bits as described above, three binary searches (search to 011 from 100) are performed.

On the other hand, the optimal code selector 426 selects the control code corresponding to the least difference value determined by the difference comparator 422 as an optimal control code for the cap bank 408 among the output codes from binary searcher during the C times of binary search.

Referring to FIG. 7, the optimal code selector 426 includes a present code register 710, a first multiplexer 712, a second multiplexer 714 and a closest code register 716.

The present code register 710 stores the present control code searched by the binary searcher 424.

The first multiplexer 712 outputs one of the present control code and the closest control code stored in the closest code register 716.

In case that the present difference value is smaller than the previously stored least difference value, the first multiplexer 712 outputs the present control code corresponding to the present difference value by interworking with the multiplexer 706 in the difference comparator 422. The outputted present control code is stored in the closest code register 716.

However, in case that the present difference value is higher than the previously stored least difference value, the first multiplexer 712 outputs the pre-stored closest control code, i.e. the least difference value is maintained.

On the other hand, the second multiplexer 714 selects also one of the present control code and the closest control code.

In one example embodiment of the present invention, since the least difference value is continuously updated while the binary search is performed, the second multiplexer 714 outputs the present control code inputted from the binary searcher 424 until the C-th binary search is finished, and outputs the optimal control code after the C-th binary search is finished. Here, the optimal control code is the closest control code stored in the closest code register 716 after the C-th binary search is finished.

In one example embodiment of the present invention, the timing logic unit 400 outputs an AFC_Done signal when the binary search on the final bit, i.e. C-th bit, is finished. In this case, the second multiplexer 714 outputs final optimal control code.

In FIG. 7, the control code for the cap bank 408 is set as 6 bits. Accordingly, the process of calculating the difference of the digital values, the comparing process, and the binary search are repeatedly performed by 6 times.

Figure 9:
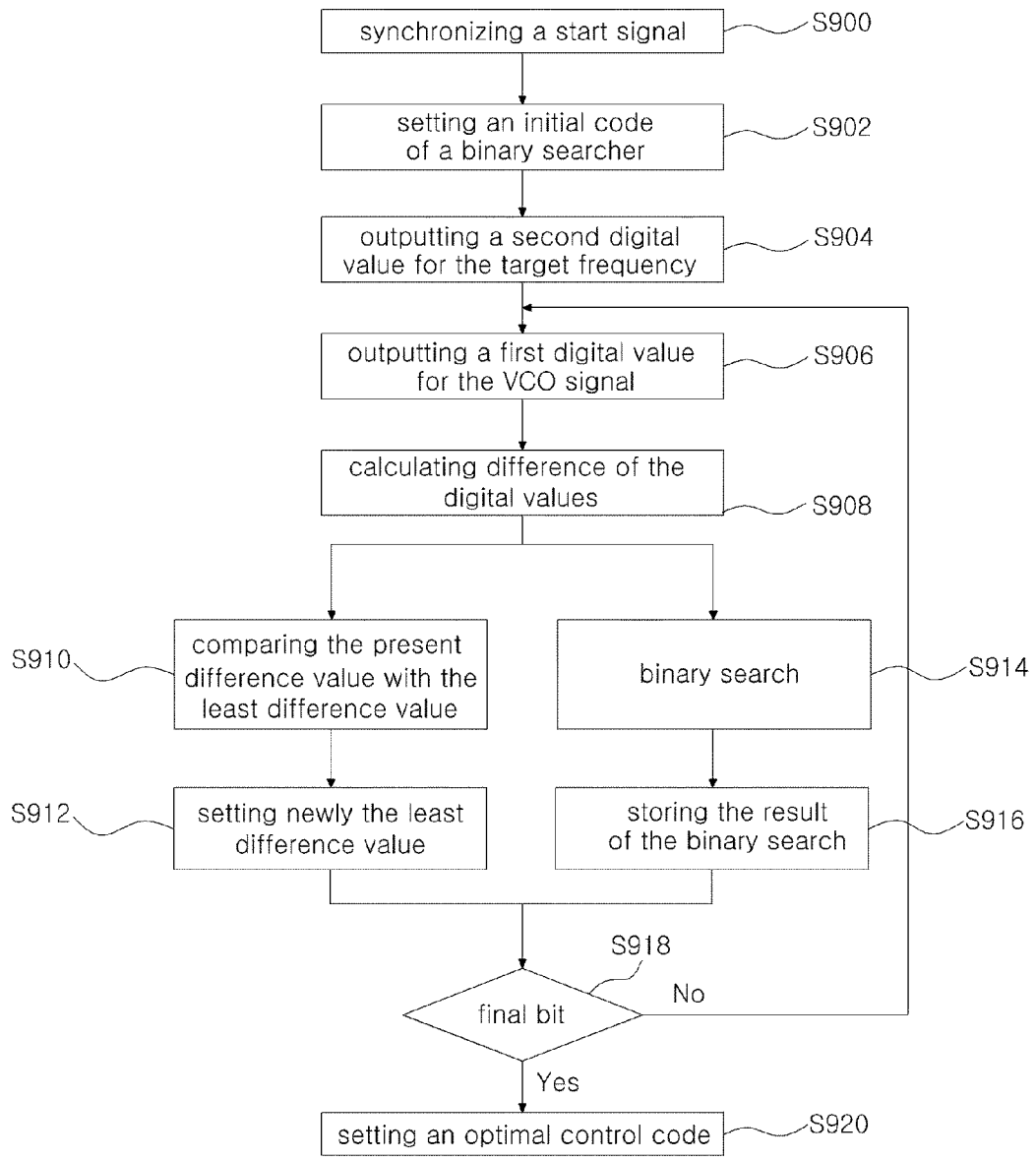
FIG. 9 is a flow chart illustrating the automatic frequency calibration process according to one example embodiment of the present invention.

FIG. 9 is a flow chart illustrating an automatic frequency calibration process according to one example embodiment of the present invention.

In FIG. 9, in step S900, the start signal of the timing logic unit 400 is synchronized to the reference signal.

Subsequently, the initial code of the binary searcher 424 is set in step S902, and then the second digital value corresponding to the target frequency is outputted in step S904. Here, the initial code of the binary searcher 424 may be set to an middle value of the whole range of the control codes for the cap bank 408 for the subsequent binary search.

In step S906, the frequency of the VCO signal is converted to the first digital value by the frequency-to-digital converter 403, and the first digital value is outputted.

In step S908, the difference of the first digital value and the second digital value is calculated.

The present difference value calculated in the step S908 is compared with the least difference value stored in the difference comparator 422 in step S910, and the relatively smaller one between the present difference value and the least difference value is newly set as the least difference value in step S912.

On the other hand, the binary search is performed by the binary searcher 424 in accordance with the relative magnitude of the first digital value and the second digital value in step S914, and then the result of the binary search is stored in step S916.

In the step S916, the control code that corresponds to the least one among the past differences of the first digital value and the second digital value, is stored as the closest control code.

The steps S906 to S916 are repeatedly performed by the bit number of the control code for the cap bank 408.

In step S918, it is determined whether or not the present bit is the final bit.

In step S920, the closest control code finally stored in the closest code selector 426 is set as the optimal control code in case that the present bit is the final bit.

In one example embodiment of the present invention, one bit search time (including some additional control time) in the automatic frequency calibration apparatus equals to (k+2)

·$T_{REF}$, and the whole calibration time corresponds to {C·(k+ 2)+3}·$T_{REF}$. Here, C is the total number of bits of the control code for the cap bank 408.

As described above, an automatic frequency calibration loop of the frequency synthesizer is finished after the optimal control code is found, and then the closed-loop locking process of the PLL is started.

Since the AFC 310 counts directly the frequency of VCO signal and compares the first digital value corresponding to the counted result with the second digital value corresponding to the target frequency, the AFC 310 may accurately calculate the difference of the frequency of the VCO signal and the target frequency.

Additionally, the AFC 310 performs the binary search on the basis of accurate difference, and so the frequency of the VCO signal may be exactly calibrated.

On the other hand, the frequency resolution and the calibration time are very important parameters in the automatic frequency calibration of the wideband frequency synthesizer.

Figure 10:
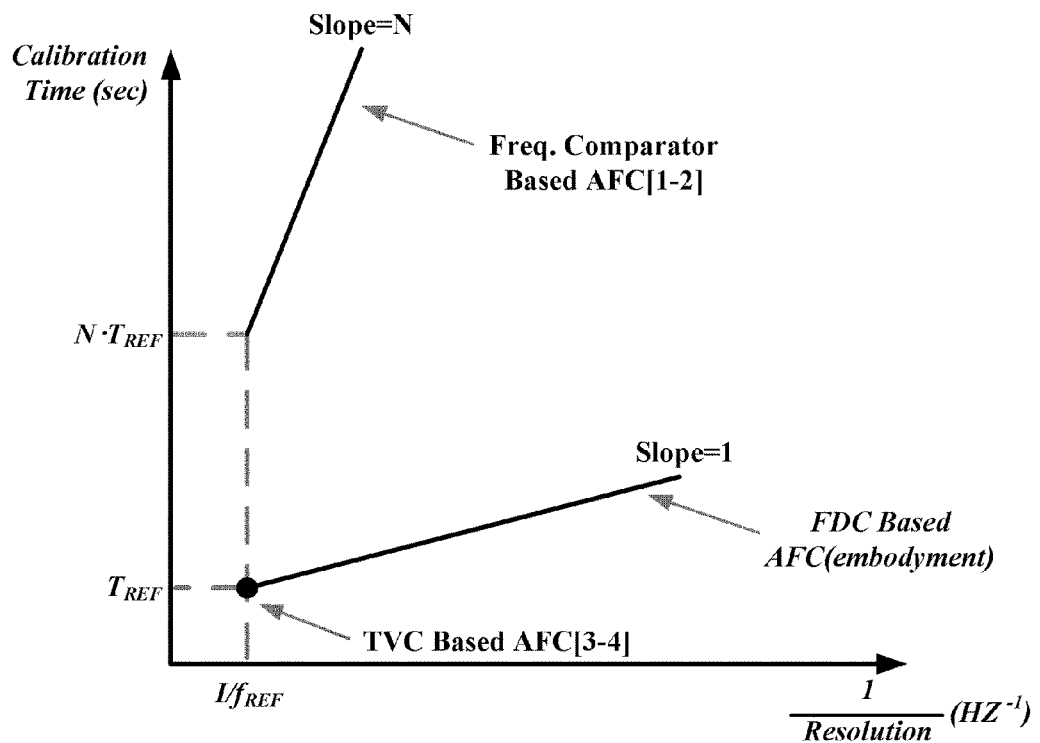
FIG. 10 is a view illustrating a graph showing the resolution-versus-calibration-time relationships of the automatic frequency calibration apparatus of the present invention and the conventional automatic frequency calibration apparatus.

FIG. 10 is a view illustrating a graph indicating the resolution-to-calibration-time performances of the automatic frequency calibration apparatus of the present invention and the conventional automatic frequency calibration apparatus.

In FIG. 10, the calibration time of the automatic frequency calibration method (FDC based AFC) of the present invention is very short compared to the conventional frequency comparator based AFC that relatively compares $f_{DIV}$ with the reference frequency $f_{REF}$ for the same frequency resolution.

Furthermore, the conventional TVC method (TVC based AFC) cannot provide smaller resolution than the reference frequency $f_{REF}$. However, the present method can provide smaller resolution than the reference frequency $f_{REF}$ by properly adjusting k.

Accordingly, it is verified that the automatic frequency calibration apparatus of the present invention has excellent performance than the conventional automatic frequency calibration apparatus, in terms of the calibration speed and the frequency resolution.

Hereinafter, the characteristics of implemented automatic frequency calibration apparatus of the present invention will be described in detail.

The wideband fractional-N frequency synthesizer with the automatic frequency calibration apparatus of the present invention is implemented and fabricated in 0.13 μm CMOS process.

The frequency synthesizer consumes 15.8 mA of current at a supply voltage of 1.2V. Here, the reference frequency $f_{REF}$ is 19.2 MHz, and the frequency tuning range of the VCO is from 1173 MHz to 1973 MHz.

Figure 11:
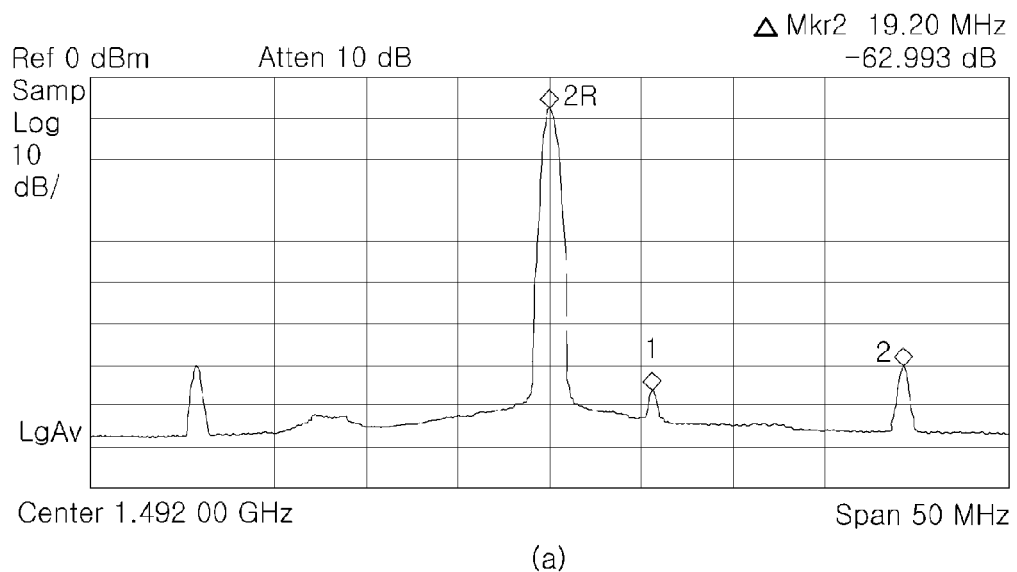
FIG. 11 is a spectrum and phase noise measurement results of an output signal from the frequency synthesizer.
Figure 11:
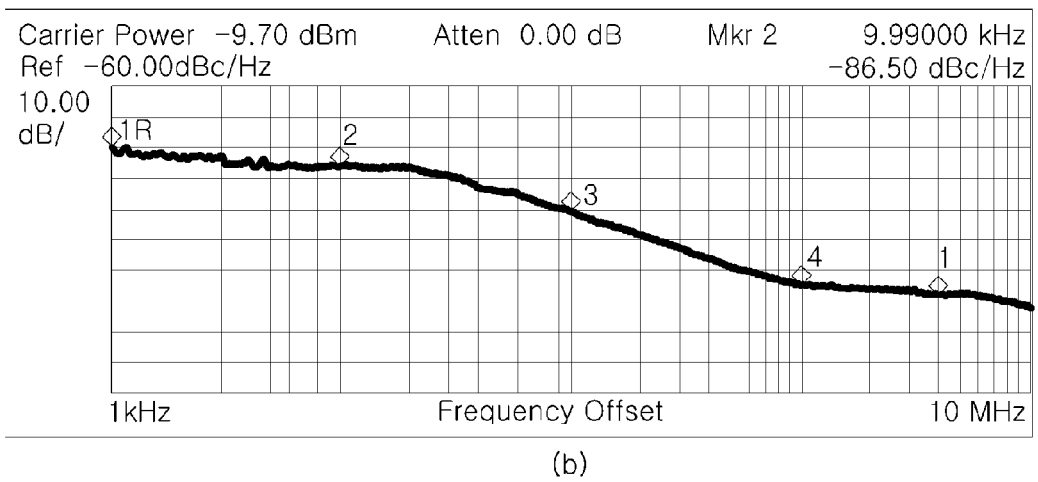

FIG. 11 is spectrum and phase noise measurement results of the output signal from the frequency synthesizer. FIG. 11A shows an output spectrum obtained by measuring the VCO output at 1.49 GHz.

Reference spur and fractional spur levels are measured as −63 dBc and −69 dBc, respectively. Phase noise performance is measured as −86.5 dBc/Hz at 10 kHz, and is measured as −124.1 dBc/Hz at 1 MHz.

Figure 12:
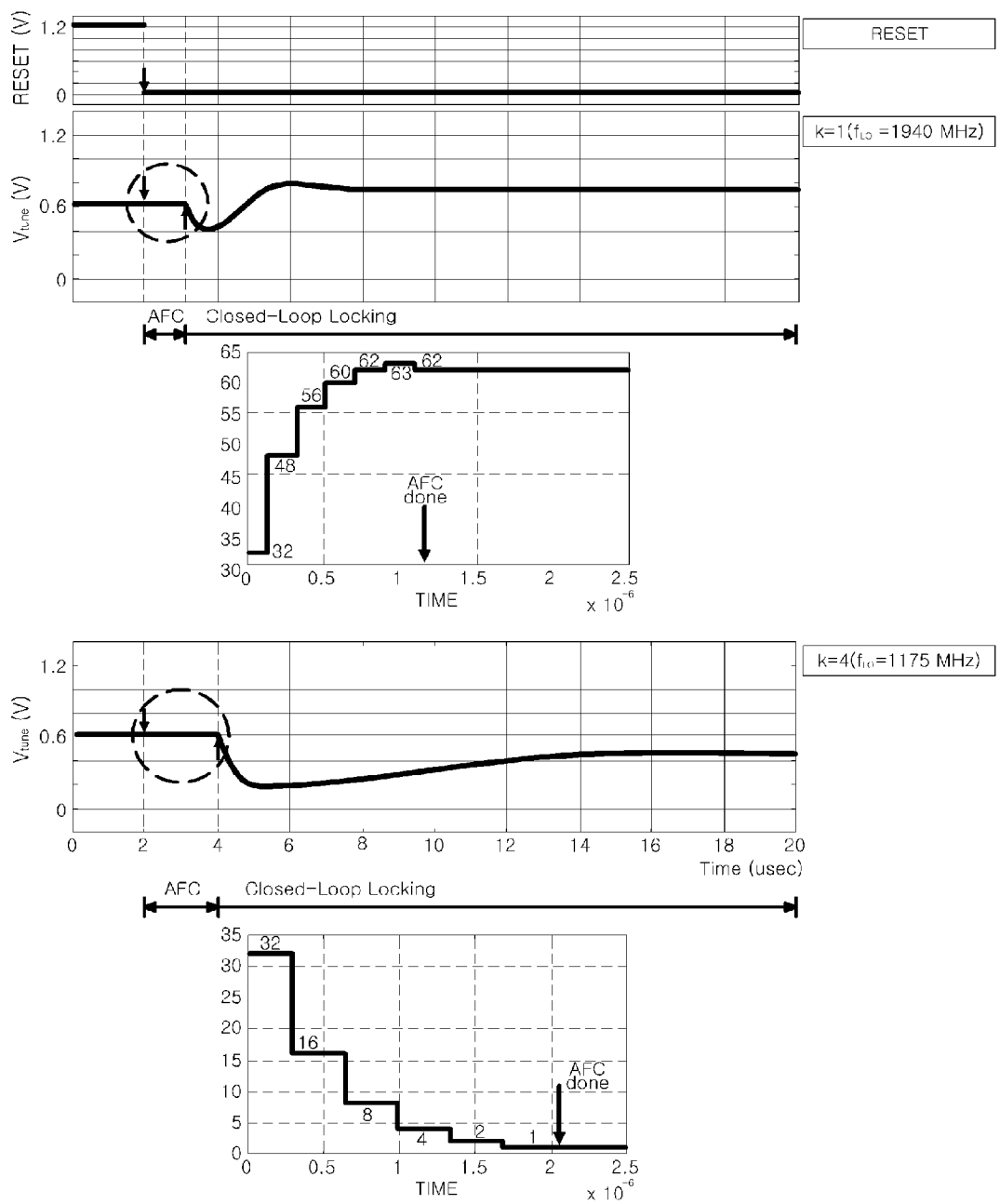
FIG. 12 is a locking time measurement results of the frequency synthesizer according to one example embodiment of the present invention.

FIG. 12 is a view illustrating measured results of a locking time of the frequency synthesizer according to one example embodiment of the present invention.

The measured calibration time of the automatic frequency calibration apparatus is 1.12 μs when k is 1, and is 2.05 μs when k is 4. That is, the automatic frequency calibration apparatus has excellent performance in terms of the calibration time.

A detailed searching process of the optimal control code is verified through a Behavioral Simulation, and is shown in the inset of FIG. 12 with the measured result.

Table 1 summarizes the measured performances of the automatic frequency calibration apparatus of the present invention.

TABLE 1

|  | Low Band | High Band |
|---|---|---|
| Target Frequency | 1175 MHz | 1940 MHz |
| $f_{spacing}$ | 9 MHz | 40 MHz |
| k | 4 | 1 |
| $f_{resolution}$ | 4.8 MHz | 19.2 MHz |
| Calibration time | 2.05 μs | 1.12 μs |

Table 1 shows representative measured results at the low band 1175 MHz and the high band 1940 MHz when the VCO has an operating band from 1173 MHz to 1973 MHz. The frequency resolution of the automatic frequency calibration apparatus should be adjusted considering the space ($f_{spacing}$) because the space ($f_{spacing}$) is changed in accordance with the frequency band in the wideband frequency synthesizer. To adjust the resolution, k is set to 4 and 1 for 1175 MHz and 1940 MHz target frequencies, respectively. As a result, the frequency resolution of the automatic frequency calibration apparatus can be set to be smaller than the space ($f_{spacing}$) of corresponding frequency band.

Since the frequency calibration time increases in proportion to k, it is measured that the calibration time for the low band is longer than that for the high band.

Table 2 compares the automatic frequency calibration method of the present invention with the conventional frequency calibration methods.

TABLE 2

|  | The present invention | [1] | [2] | [3] | [4] |
|---|---|---|---|---|---|
| Frequency Comparison Method | Frequency-to-Digital Converter | Relative Frequency Comparator | Relative Frequency Comparator | Time-to-Voltage Converter | Time-to-Voltage Converter |
| Search Algorithm | Binary Search with Optimal Code Selection | Binary Search | Binary Search | Linear Search | Binary Search with Optimal Code Selection |
| Finest Resolution Achievable in a Time Period of k · $T_{REF}$ | $f_{REF}/k$ | $f_{VCO}/(4·k)$ | $f_{VCO}/(8·k)$ | $f_{REF}$ | $f_{REF}$ |
| Applicability to ΣΔ Fractional-N PLL | Possible | Possible but Slow | Possible but Slow | Impossible | Impossible |

As shown in Table 2, the automatic frequency calibration method of the present invention can provide a very high frequency resolution of $f_{REF}/k$ in a given time of k·$T_{REF}$, which are much better than the conventional methods [1-4] in terms of the calibration speed and resolution. {References: [1] H. Lee et al., "A SD Fractional-N Frequency Synthesizer Using a Wide-Band Integrated VCO and a Fast AFC Technique for GSM/GPRS/WCDMA Applications," IEEE Journal of Solid-State Circuits, vol. 39, no. 7, July 2004, [2] M.

Marutani et al., "An 18 mW 90 to 770 MHz Synthesizer with Agile Auto-Tuning for Digital TV Tuners," IEEE Int. Solid-State Circuits Conference, February 2006, [3] T. Lin et al., "An Agile VCO Calibration Technique for a 10-GHz CMOS PLL," IEEE Journal of Solid-State Circuits, vol. 42, no. 2, February 2007), [4] J. Lee et al., "A 480-MHz to 1-GHz Sub-picosecond Clock Generator with a Fast and Accurate Automatic Frequency Calibration in 0.13-mm CMOS," IEEE Asian Solid-State Circuits Conference, November 2007}.

In addition, unlike the conventional relative frequency comparison method, the present invention determines in advance the constant target value $N_{target}$ corresponding to the target frequency and then calculates the difference of the target value (the second digital value) and the present counted value (the first digital value). Hence, even the delta-sigma fractional-N frequency synthesizer may be calibrated rapidly without the delta-sigma modulator operated.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. An automatic frequency calibration apparatus for a phase-locked loop based frequency synthesizer, the apparatus comprising:
    a frequency-to-digital converter configured to count directly a frequency of a VCO output signal from a VCO and convert the frequency of the VCO output signal into a first digital value;
    a target value setting section configured to output a second digital value corresponding to a target frequency; and
    a finite state machine configured to calibrate the frequency of the VCO output signal by using a difference of the first digital value and the second digital value,
    wherein the frequency-to-digital converter includes:
    a frequency divider configured to divide the frequency of the VCO output signal with a given dividing ratio, convert the divided signals into multiple phase signals having multiple phases, and output the multiple phase signals;
    at least one counter configured to count at least one of the multiple phase signals; and
    an adder configured to add the counted results by the at least one counter.

2. The automatic frequency calibration apparatus of claim 1, wherein a frequency resolution is adjusted by changing the operation time of the counter in accordance with a frequency space between adjacent VCO frequency characteristic curves.

3. The automatic frequency calibration apparatus of claim 1 or claim 2, wherein the target value setting section calculates the second digital value by using a reference frequency, an integer dividing ratio, and a fractional dividing ratio.

4. The automatic frequency calibration apparatus of claim 1 or claim 2, wherein the finite state machine including:
    a difference calculator configured to calculate the difference of the first digital value and the second digital value;
    a binary searcher configured to perform a binary search in accordance with the difference of the first digital value and the second digital value; and
    an optimal code selector configured to select an optimal control code through the difference and the searched result so that the VCO outputs the VCO output signal having the closest frequency to the target frequency.

5. The automatic frequency calibration apparatus of claim 4, wherein the difference calculator provides one of a fast flag signal or a slow flag signal corresponding to the difference of the digital values, and the binary searcher performs the binary search in accordance with the fast flag signal or the slow flag signal.

6. The automatic frequency calibration apparatus of claim 4, wherein the first digital value is changed by the control code selected by the optimal code selector before the frequency calibration is finished, and the difference calculator outputs periodically a difference value of the changed first digital value and the second digital value.

7. The automatic frequency calibration apparatus of claim 6, wherein the finite state machine further includes a difference comparator for comparing a present difference value outputted from the difference calculator with pre-stored least difference value and setting newly the least difference value in accordance with the compared result.

8. The automatic frequency calibration apparatus of claim 7, wherein the optimal code selector stores the control code searched by the binary searcher as a closest control code at a time point at which the least difference value is newly set.

9. The automatic frequency calibration apparatus of claim 8, wherein the binary search is repeatedly performed by C times in case that the control code is made up of C bits, and the optimal code selector outputs the closest control code, stored after performing repeatedly the binary search by C times, as the optimal control code.

10. The automatic frequency calibration apparatus of claim 1 or claim 2, further comprising:
    a timing logic unit configured to generate a timing signal for start and finish of the automatic frequency calibration.

11. An automatic frequency calibration apparatus for a fractional-N frequency synthesizer based on a phase-locked loop, the apparatus comprising:
    a frequency divider configured to divide a frequency of VCO output signal with a given dividing ratio, convert the divided signals into multiple phase signals having multiple phases, and output the multiple phase signals; and
    at least one counter configured to count at least one of the multiple phase signals; and
    an adder configured to add the counted results,
    wherein the counted results are identical to a value obtained by counting directly the VCO output signal, a frequency of the VCO output signal is converted into a first digital value through the counter, the first digital value is compared with a second digital value corresponding to a target frequency, and the frequency of the VCO output signal is calibrated in accordance with the compared result.

12. An automatic frequency calibration method for a phase-locked loop based fractional-N frequency synthesizer, the method comprising:

counting directly a frequency of a VCO output signal; and comparing a first digital value in accordance with the counted result with a second digital value corresponding to a target frequency, and calibrating the frequency of the VCO output signal in accordance with the compared result, wherein the counting procedure includes:

dividing the VCO output signal with a given dividing ratio;

converting the divided signals into multiple signals having multiple phases; and counting the multiple phase signals and then adding the counted results.

* * * * *